(12) United States Patent
Chankya et al.

(10) Patent No.: US 8,089,822 B1
(45) Date of Patent: Jan. 3, 2012

(54) ON-CHIP POWER-MEASUREMENT CIRCUIT USING A LOW DROP-OUT REGULATOR

(75) Inventors: Talluri V. Chankya, Bangalore (IN); V. Sambasiva Rao, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 675 days.

(21) Appl. No.: 11/705,288

(22) Filed: Feb. 12, 2007
(Under 37 CFR 1.47)

(51) Int. Cl.
*G11C 5/14* (2006.01)

(52) U.S. Cl. ............... 365/226; 365/189.09; 365/191

(58) Field of Classification Search .......... 365/227, 365/226, 191, 189.09
See application file for complete search history.

(56) References Cited

U.S. PATENT DOCUMENTS

| | | | |
|---|---|---|---|
| 5,140,182 A | 8/1992 | Ichimura | |
| 5,499,183 A | 3/1996 | Kobatake | |
| 5,574,634 A | 11/1996 | Parlour et al. | |
| 5,982,223 A | 11/1999 | Park et al. | |
| 6,018,264 A | 1/2000 | Jin | |
| 6,175,264 B1 | 1/2001 | Jinbo | |
| 6,292,048 B1 | 9/2001 | Li | |
| 6,373,323 B2 | 4/2002 | Kuroda | |
| 6,373,324 B2 | 4/2002 | Li et al. | |
| 6,459,328 B1 | 10/2002 | Sato | |
| 6,473,321 B2 | 10/2002 | Kishimoto et al. | |
| 6,486,729 B2 | 11/2002 | Imamiya | |
| 6,529,421 B1 | 3/2003 | Marr et al. | |
| 6,545,529 B2 | 4/2003 | Kim | |
| 6,759,836 B1 | 7/2004 | Black, Jr. | |
| 6,917,237 B1 | 7/2005 | Tschanz et al. | |
| 6,927,621 B2 | 8/2005 | Yamada | |
| 7,030,682 B2 | 4/2006 | Tobita | |
| 7,116,156 B2 | 10/2006 | Myono et al. | |
| 7,173,477 B1 | 2/2007 | Raghavan | |
| 7,227,403 B2 | 6/2007 | Kim | |
| 7,276,960 B2 | 10/2007 | Peschke | |
| 7,307,467 B2 | 12/2007 | Goodnow et al. | |
| 7,425,861 B2 | 9/2008 | Egerer et al. | |
| 7,504,876 B1 * | 3/2009 | Raghavan et al. | 327/536 |
| 7,723,979 B2 * | 5/2010 | Ashburn et al. | 324/142 |

OTHER PUBLICATIONS

McGowen et al., "Power and Temperature Control on a 90-nm Itanium Family Processor," IEEE Journal of Solid-State Circuits, vol. 41, No. 1, Jan. 2006, pp. 229-237; 9 pages.
USPTO Notice of Allowance for U.S. Appl. No. 11/478,006 dated Oct. 31, 2008; 4 pages.
USPTO Non-Final Rejection for U.S Appl. No. 11/478,006 dated Nov. 21, 2007; 4 pages.
USPTO Notice of Allowance for U.S Appl. No. 12/380,492 dated Feb. 26, 2010; 4 pages.
USPTO Notice of Allowance for U.S Appl. No. 12/380,492 dated Jan. 28, 2010; 4 pages.
USPTO Non-Final Rejection for U.S Appl. No. 12/380,492 dated Aug. 7, 2009; 6 pages.

(Continued)

*Primary Examiner* — Amir Zarabian
*Assistant Examiner* — Kretelia Graham

(57) ABSTRACT

A circuit and method are provided for controlling power consumption in an electronic circuit. Generally, the method involves measuring current flow through a memory core in the circuit, the memory core including a number of cells each with a number of active devices, and, if current flow exceeds a predetermined amount limiting it by applying reverse body bias to the active devices. In one embodiment, power is supplied to the memory through a low drop-out (LDO) regulator fabricated on a common substrate therewith, and the LDO regulator functions as a current mirror to mirror current through the memory core through a replica stack. Other embodiments are also disclosed.

19 Claims, 4 Drawing Sheets

OTHER PUBLICATIONS

USPTO Notice of Allowance for U.S Appl. No. 10/978,045 dated Oct. 19, 2006; 6 pages.
USPTO Final Rejection for U.S Appl. No. 10/978,045 dated Aug. 3, 2006; 7 pages.
USPTO Non-Final Rejection for U.S Appl. No. 10/978,045 dated Apr. 5, 2006; 7 pages.
USPTO Notice of Allowance for U.S Appl. No. 12/380,492 dated Apr. 15, 2010; 4 pages.

* cited by examiner

ON-CHIP POWER-MEASUREMENT CIRCUIT USING A LOW DROP-OUT REGULATOR

TECHNICAL FIELD

The present invention relates generally to reducing power consumption in electronic devices, and more particularly to an on-chip power measurement circuit having an embedded low drop-out regulator and methods of using the same to measure and limit or control power in both active and standby modes.

BACKGROUND OF THE INVENTION

Many mobile or portable electronic devices, such as cellular telephones, portable computers, cameras, and camcorders operate on battery power. Thus, reducing power consumption is an important issue, as consumers increasingly demand longer times between recharging.

One known method for minimizing power consumption in electronic devices is to place the device in a low-power standby mode, as compared to an active mode, in which power to all unnecessary circuitry is reduced or removed while the device is idle. Generally, power consumption is further minimized by monitoring or measuring power consumption and controlling or adjusting power supplied to circuits and elements in the device using a power measurement circuit. Typically, the power measurement circuit includes separate circuits for measuring both power consumption in the active mode, and power consumption in the standby mode, commonly referred to as leakage current.

One circuit or element commonly powered down when a battery operated device is idle is a semiconductor memory. A memory typically includes a memory core with from one million to a few million or more cells, each having one or more active elements, transistors, which may be programmed to store data. A conventional power measurement circuit 100 for measuring and controlling power consumption in a memory core 102 in standby mode is shown in FIG. 1. Referring to FIG. 1, the power measurement circuit 100 typically includes a leakage measurement circuit 104 having a baseline element or device 106 coupled in series with a reference current source 108 between a supply voltage ($V_{cch}$) and electrical ground ($V_{gnd}$). The supply voltage supplies power to the memory core 102. The baseline device 106 is a scaled replica of the memory core 102 so that leakage current through the memory core in standby mode can determined or approximated by measuring current through the baseline device. That is the baseline device a replica of the entire million cell core representative of millions of cells. The power measurement circuit 100 further includes a comparator 110 and body biasing control circuitry, such as a negative charge pump 112, coupled between an output of the comparator and body or bulk contacts of active elements (not shown) in the memory core 102. In operation, the voltage (ml) dropped by the baseline device 106, which is dependent on leakage current therethrough, is compared with a predetermined, known reference voltage ($V_{BG}$). If the baseline device 106 leakage is higher than predetermined value, the comparator 110 triggers or enables the negative charge pump 112, and a reverse body bias is applied to memory cell transistors as well as to the baseline device 106, thereby reducing leakage current through the memory core 102.

Power consumption in the active mode or active current for the memory chip can be measured and controlled using a separate power measurement circuit (not shown). In one conventional or known method, described for example in Rich McGowen, "Power and Temperature Control on a 90-nm Itanium Family Processor" IEEE JOURNAL OF SOLID-STATE CIRCUITS, VOL. 41, NO. 1, JANUARY 2006, the active current is measured using package resistance and analog-to-digital converters. If the active current measured is greater than a predetermined value, control circuitry in the power measurement circuit reduces the power supplied to the memory chip.

One problem with conventional power measurement circuits and methods is that the leakage measurement circuit does not take into account within die variations in threshold voltage ($V_T$) of transistors or elements in the memory core or between the memory core and the baseline device. In particular, since sub-threshold leakage is exponential dependent on $V_T$ variations, performance of a single, internal baseline device is generally not representative of performance of all elements in the memory core, which may contain a million or more memory cells each with one or more active elements.

Another problem with conventional approach is that the circuit and method for measuring power consumption in the active mode is complex increasing the manufacturing and/or operating costs of the circuit or the device in which it is used.

Accordingly, there is a need for an improved power measurement and control circuit and method of operating the same, which are capable of accurately measuring and regulating power by taking into account within die $V_T$ variations. It is desirable that the power measurement circuit is capable of operating in both the standby and active power modes. It is further desirable that the power measurement circuit and method achieve these results substantially without increasing circuit complexity and/or manufacturing costs of the circuit or the device in which it is used.

The present invention provides a solution to these and other problems, and offers further advantages over conventional power measurement circuits and methods of operating the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to circuits and methods for controlling power consumption in an electronic circuit or device, and in particular for controlling power consumption in battery powered mobile or portable devices, such as cellular telephones, portable computers, cameras, and camcorders.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

The circuit and method of the present invention make it particularly suitable for controlling power consumption in a circuit or device having a memory with a memory core having a number of cells each with a number of active devices.

Briefly, the method of the present invention for involves measuring current flow through the memory core, and, if current flow exceeds a predetermined amount limiting it by applying reverse body bias to active devices in the memory core. Preferably, power is supplied to the memory through an on-chip, low drop-out (LDO) regulator embedded in the circuit. More preferably, the LDO regulator is fabricated on a common substrate with the memory core. The LDO regulator functions as a current mirror to mirror current through the memory core through a replica stack. The current flow measured through the replica stack is converted to a voltage and compared with a reference voltage. If the current flow exceeds a predetermined amount, current flow through the memory core is limited by applying reverse body bias to the active devices.

Figure 1:
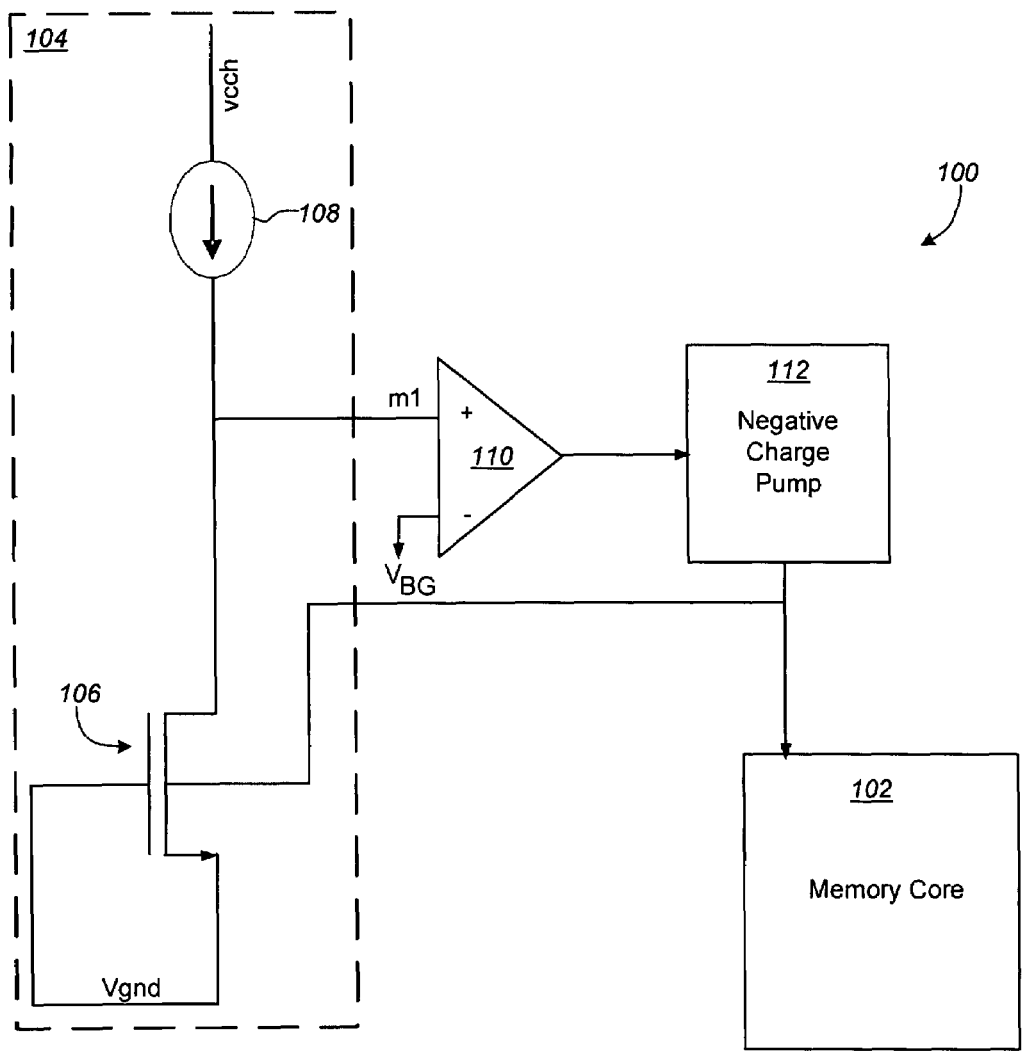
FIG. 1A (Prior Art) is a schematic diagram of a conventional power measurement circuit.
Figure 2:
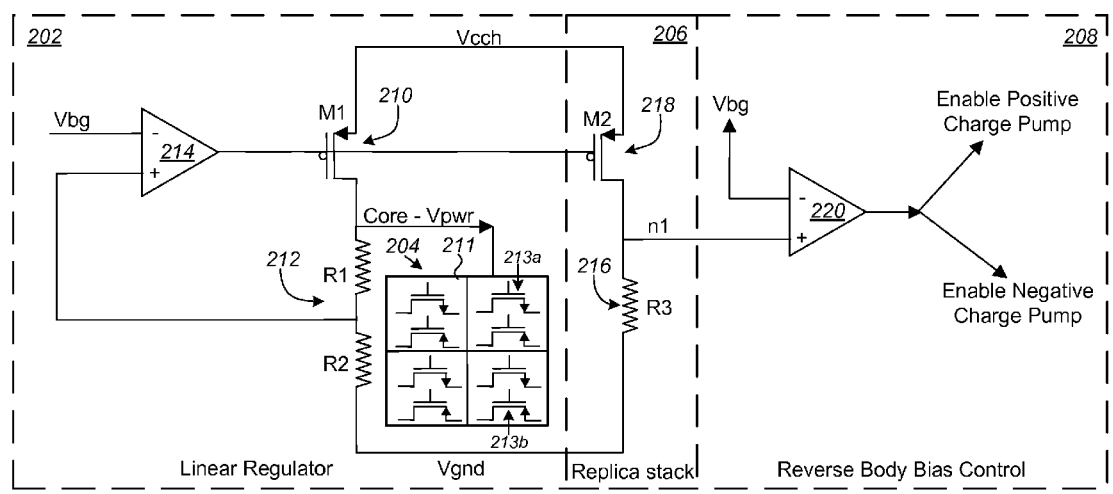
FIG. 2 is a schematic diagram of an on-chip power measurement and control circuit having a low drop-out (LDO) regulator according to an embodiment of the present invention.
Figure 3:
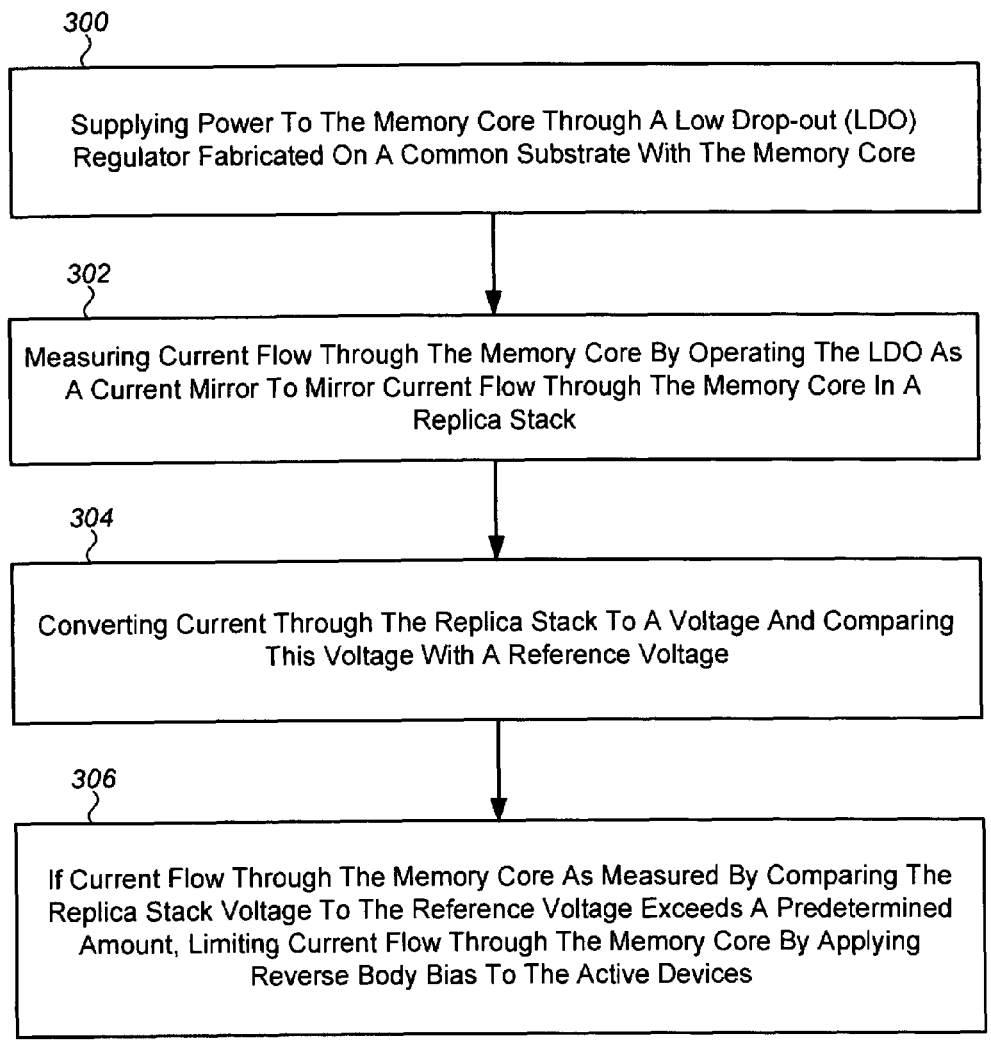
FIG. 3 is a flow chart of a method of operating an on-chip power measurement circuit according to an embodiment of the present invention.
Figure 4:
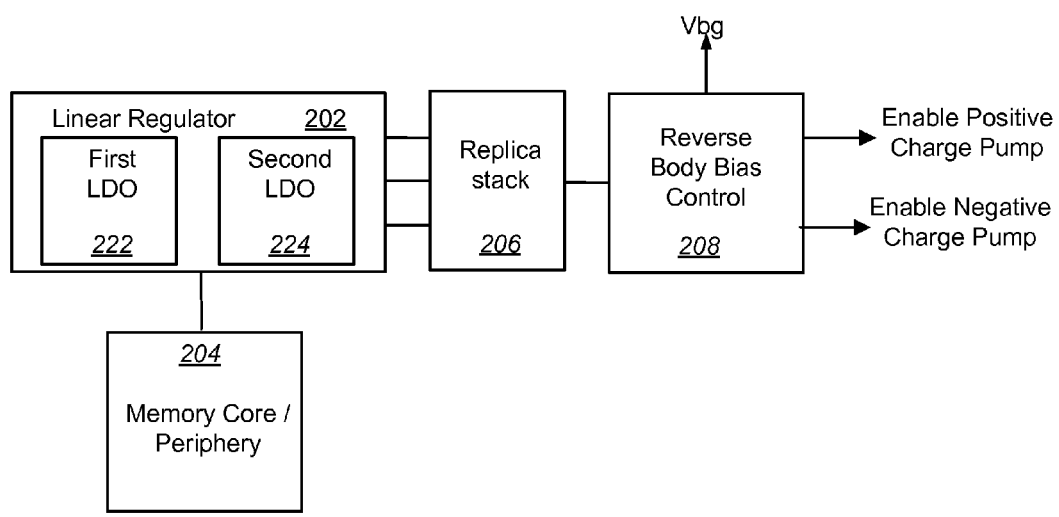
FIG. 4 is a block diagram of an on-chip power measurement and control circuit having first and second low drop-out (LDO) regulators according to another embodiment.

The circuit and methods for operating the same according to various embodiments of the present invention will now be described in greater detail with reference to FIGS. 2 and 3, where FIG. 2 is a schematic diagram of a power measurement and control circuit according to an embodiment of the present invention, and FIG. 3 is a flowchart of a method operating the same to reduce power consumption. For purposes of clarity, many of the details of integrated circuit (IC) design in general and memory devices in particular that are widely known and are not relevant to the present invention have been omitted from the following description.

Referring to FIG. 2, the power measurement and control circuit 200 generally includes a linear regulator 202 through which electrical power (Core-Vpwr) is supplied from a supply voltage ($V_{cch}$) to the memory core/periphery 204, a replica stack 206, and a reverse body bias control 208 (RBB) adapted to apply a reverse body bias to active elements, such as transistors, within memory cell of the memory core 204, thereby reducing power consumption of the memory core.

In one embodiment, the linear regulator 202 is a low dropout (LDO) regulator a having a voltage divider 212 including a number of impedance elements, such as resistors R1 and R2, coupled to electrical ground ($V_{gnd}$) and to the supply voltage ($V_{cch}$) through a switching element 210, such as a P-type metal-on-semiconductor (PMOS) transistor (M1). An amplifier/comparator 214 compares a voltage tapped off from the voltage divider 212 to a with a predetermined, known reference voltage, such as a band gap voltage ($V_{BG}$), and controls transistor M1 to regulate current flow therethrough to provide to stable power (Core-Vpwr) to the memory core 204. The memory core 204 includes a number of cells 211 each with a number of active devices, including a number of NMOS transistors 213a and/or PMOS transistors 213b.

As noted above, preferably the LDO regulator 202 is an embedded part of the electronic circuit or device for which the power measurement and control circuit 200 is used to control power consumption. More preferably, elements of the LDO regulator 202 are fabricated on-chip on a common substrate with the memory core 204.

The replica stack 206 generally includes an impedance element 216, such as resistor R3, coupled to ground ($V_{gnd}$) and to the supply voltage ($V_{cch}$) through a switching element 218, such as a PMOS transistor (M2), controlled by the comparator/amplifier 214 in the linear regulator 202. Switching elements 210 and 218 (transistors M1 and M2), operate in the saturation region functions as a current mirror. It will be appreciated by those skilled in the art that proper selection of the ratio between transistors M1 & M2 sizes, enables the replica stack 206 to generate a voltage signal (n1), which represents a scaled version of actual current through the memory core 204, and not merely an approximation as with the baseline device 106 of the conventional circuit 100. It will further be appreciated that the ability to accurately measure actual current through the memory core 204 enables power consumption to be accurately measured and regulated substantially without impact by within die variations of the threshold voltages ($V_T$) and/or drain-to-source voltages ($V_{DS}$) of transistors in the memory core, or between the memory core and a baseline device 106.

The reverse body bias control or RBB 208 generally includes a comparator 220 to compare the voltage signal (n1) from the replica stack 206 to a known reference voltage, such as a band gap voltage ($V_{BG}$). The output of the comparator 220 triggers or enables the one or more charge pumps to apply a reverse body bias to the active elements or transistors within memory cells of the memory core 204, thereby reducing power consumption of the memory core. In the embodiment shown, the output of the comparator 220 is coupled to trigger or enable a negative charge pump to apply reverse body bias to N-type metal-on-semiconductor (NMOS) transistors within memory cells of the memory core 204, and to trigger or enable a positive charge pump to apply reverse body bias to PMOS transistors within memory cells of the memory core.

Alternatively, the output of the comparator 220 can be coupled to control circuitry (not shown) in the power supply circuit to reduce the supply voltage ($C_{core\_}V_{pwr}$) supplied to the memory core 204.

It will be appreciated by those skilled in the art that the power measurement and control circuit of the present invention is capable of accurately measuring and regulating power consumption in both the standby and active power modes. In certain embodiments, this accomplished using separate but substantially identical power measurement and control circuits. In other embodiments, power consumption can be measured and regulated in both the standby and active power modes using a single, power measurement and control circuit similar to that described above, but having separate LDO regulators. An embodiment of a measurement and control circuit having a first LDO regulator 222 to supply power to the memory core 204 if the memory core is operating in a standby mode, and a second LDO regulator 224 to supply power to the memory core if the memory core is operating in an active mode is shown in FIG. 6.

Methods for operating the above described power measurement and control circuit to reduce power consumption according to various embodiments of the present invention will now be described in greater detail with reference to the flowchart of FIG. 3.

Referring to FIG. 3, the method begins with supplying power to the memory core through a LDO regulator fabricated on a common substrate with the memory core (step 300). Preferably, as detailed above, the circuit includes multiple, separate LDO regulators to supply power to the memory core in the active and standby modes. Next, current flow through the memory core is measured by operating the LDO as a current mirror and mirroring at least a scaled version of the current flow through the memory core through the replica stack (step 302). Measured current flow through the replica stack is converted to a voltage and compared with a reference voltage (step 304). If the current flow through the memory core as measured by comparing the replica stack voltage to the reference voltage exceeds a predetermined amount, current flow through the memory core is limited by applying reverse body bias to the active devices (step 306).

The advantages of the circuit and method of the present invention over previous or conventional circuits and methods include: (i) the ability to accurately measure and regulate power consumption by taking into account within die $V_T$ and $V_{DS}$ variations; (ii) the ability to operate in both the standby and active power modes using separate LDO regulators; (iii) the ability to achieve these results substantially without increasing circuit complexity and/or manufacturing costs; and (iv) the ability to regulate power consumption in active mode to a predetermined value by reducing the speed of chip or memory core.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method for controlling power consumption in an electronic circuit, the method comprising:
   measuring current flow through a memory core in the electronic circuit, the memory core including a number of cells each with a number of active devices; and
   if current flow through the memory core exceeds a predetermined amount limiting current flow therethrough by applying reverse body bias to the number of active devices in the memory core, wherein measuring current flow through the memory core comprises supplying power to the memory core through a low drop-out (LDO) regulator.

2. The method according to claim 1, wherein the LDO regulator is part of the electronic circuit.

3. The method according to claim 2, wherein the LDO regulator is fabricated on a common substrate with the memory core.

4. The method according to claim 1, wherein the LDO regulator functions as a current mirror, and wherein measuring current flow through the memory core comprises mirroring current through the memory core through a replica stack.

5. The method according to claim 4, wherein measuring current flow through the memory core comprises converting current through the replica stack to a voltage and comparing this voltage with a reference voltage.

6. The method according to claim 4, wherein measuring current flow through the memory core comprises operating the LDO regulator in its saturation region.

7. The method according to claim 1, wherein the number of active devices in the memory core comprise a number of N-type metal-on-semiconductor (NMOS) transistors, and wherein limiting current flow through the memory core comprises enabling a negative charge pump to apply reverse body bias to the NMOS devices.

8. The method according to claim 1, wherein the number of active devices in the memory core comprise a number of P-type metal-on-semiconductor (PMOS) transistors, and wherein limiting current flow through the memory core comprises enabling a positive charge pump to apply reverse body bias to the PMOS devices.

9. A circuit for controlling power consumption in a memory core including a number of cells each with a number of active devices, the circuit comprising:
   a replica stack;
   a linear regulator to supply power to the memory core, and to mirror current flow through the memory core in the replica stack; and
   a reverse body bias control to measure current flow through the memory core by comparing current flow through the replica stack to a predetermined reference value, the reverse body bias control further configured to, if the current flow through the memory core exceeds the predetermined reference value, limit current flow through the memory core by applying reverse body bias to the number of active devices.

10. The circuit according to claim 9, wherein the linear regulator comprises a low drop-out (LDO) regulator fabricated on a common substrate with the memory core.

11. The circuit according to claim 10, wherein the linear regulator comprises at least two LDO regulators including a first LDO regulator to supply power to the memory core if the memory core is operating in a standby mode, and a second LDO regulator to supply power to the memory core if the memory core is operating in an active mode.

12. The circuit according to claim 9, wherein the number of active devices in the memory core comprise a number of N-type metal-on-semiconductor (NMOS) transistors, and wherein the reverse body bias control further comprises a negative charge pump to apply reverse body bias to the NMOS devices if the current flow through the memory core exceeds the predetermined reference value.

13. The circuit according to claim 9, wherein the number of active devices in the memory core comprise a number of P-type metal-on-semiconductor (PMOS) transistors, and wherein the reverse body bias control further comprises a positive charge pump to apply reverse body bias to the PMOS devices if the current flow through the memory core exceeds the predetermined reference value.

14. A method for controlling power consumption in a memory core including a number of cells each with a number of active devices, the method comprising:
   supplying power to the memory core through a low drop-out (LDO) regulator fabricated on a common substrate with the memory core;
   measuring current flow through the memory core by operating the LDO as a current mirror to mirror current flow through the memory core in a replica stack; and
   if current flow measured through the memory core exceeds a predetermined amount limiting current flow therethrough by applying reverse body bias to the number of active devices in the memory core.

15. The method according to claim 14, wherein measuring current flow through the memory core comprises converting current through the replica stack to a voltage and comparing this voltage with a reference voltage.

16. The method according to claim 14, wherein measuring current flow through the memory core comprises operating the LDO regulator in its saturation region.

17. The method according to claim 14, wherein the number of active devices in the memory core comprise a number of N-type metal-on-semiconductor (NMOS) transistors, and wherein limiting current flow through the memory core comprises enabling a negative charge pump to apply reverse body bias to the NMOS devices.

18. The method according to claim 14, wherein the number of active devices in the memory core comprise a number of P-type metal-on-semiconductor (PMOS) transistors, and wherein limiting current flow through the memory core comprises enabling a positive charge pump to apply reverse body bias to the PMOS devices.

19. The method according to claim 14, wherein supplying power to the memory core comprises supplying power to the memory core through a first LDO regulator if the memory core is operating in a standby mode, and supplying power to the memory core through a second LDO regulator if the memory core is operating in an active mode.

* * * * *